(12) United States Patent
Chang

(10) Patent No.: US 7,498,798 B2
(45) Date of Patent: Mar. 3, 2009

(54) CURRENT-TO-VOLTAGE DETECTION CIRCUIT

(75) Inventor: I-Chang Chang, Sijhih (TW)

(73) Assignee: Iwei Technology Co., Ltd., Sijhih, Taipei County (TW)

( * ) Notice: Subject to any disclaimer, the term of this patent is extended or adjusted under 35 U.S.C. 154(b) by 0 days.

(21) Appl. No.: 11/378,369

(22) Filed: Mar. 20, 2006

(65) Prior Publication Data

US 2007/0216393 A1 Sep. 20, 2007

(51) Int. Cl.
G01R 19/00 (2006.01)
H02M 11/00 (2006.01)

(52) U.S. Cl. .................... 324/76.11; 327/103

(58) Field of Classification Search .......... 324/76.11, 324/522, 713, 348; 327/103, 334, 348, 322
See application file for complete search history.

(56) References Cited

U.S. PATENT DOCUMENTS 5,327,303 A * 7/1994 Smith ............... 360/67
6,417,702 B1 * 7/2002 Wang ............... 327/103
2004/0000483 A1 * 1/2004 Jackson et al. ............... 204/601

* cited by examiner

*Primary Examiner*—Vincent Q Nguyen
*Assistant Examiner*—Hoai-An D Nguyen
(74) *Attorney, Agent, or Firm*—Muncy, Geissler, Olds & Lowe, PLLC

(57) ABSTRACT

A current-to-voltage detection circuit includes a detection circuit, a reference voltage component, a resistor component, a load, a detection part and an amplifier. The detection circuit uses the reference voltage component to produce a fixed reference voltage which comes up with a reference potential at a point B. When the load is turned on to form a system loop, a grounding end of the detection part can produce a reference potential of tiny mV at a point A. A common reference potential is produced at a point C upon comparing the point A with the point B. When the reference potential at the point A is greater than the reference potential at the point B, a voltage at the output end of the amplifier is converted from a low potential into a high potential, and a circuit of related system can be controlled by a change between the potentials.

4 Claims, 5 Drawing Sheets

CURRENT-TO-VOLTAGE DETECTION CIRCUIT

BACKGROUND OF THE INVENTION (a) Field of the Invention

The present invention relates to a current-to-voltage detection circuit, and more particularly to an improved current-to-voltage detection circuit.

(b) Description of the Prior Art

Referring to FIG. 1 and FIG. 2, it shows a conventional detection circuit A. Whenever an amplifier A1 is to perform a comparison and amplification to a direct-current voltage, an operating voltage A3 of system loop A2, or a positive voltage is passing through a detection part A4 to detect a potential difference between a positive end and a cathode end of the system loop A2, and to obtain a size of current of the system loop A2 after performing a comparison through the potential difference between two ends. However, a potential difference between two ends of the amplifier A1 should be greater than 40 mV to enable the amplifier A1 to effectively determine, amplify, and output. In addition, the detection circuit A should use two sets of operational power supplies A3, and the detection circuit A is easily affected by an interference of ambient environment and a noise of entire system loop A2, such that the detection circuit A can easily generate a wrong action. If the potential difference between two ends of the detection part A4 is too small, it is easy to prohibit the amplifier A1 to operate.

Accordingly, how to solve the aforementioned problem is a technical issue to be resolved by the inventor of present invention.

SUMMARY OF THE INVENTION

The present invention is to provide an improved current-to-voltage detection circuit wherein an end of a detection part is connected to a cathode end of an operational power supply, and the other end of the detection part is connected to a grounding end of a system loop. Furthermore, the detection circuit which is connected to the detection part is used in association with an electronic component, such as an amplifier, an ASIC (Application-Specific Integrated Circuit) component, and all kinds of semiconductor components having an amplification function. The detection circuit will detect and amplify a voltage between two ends of the detection part, and to obtain and fix a size of current, through the known voltage.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
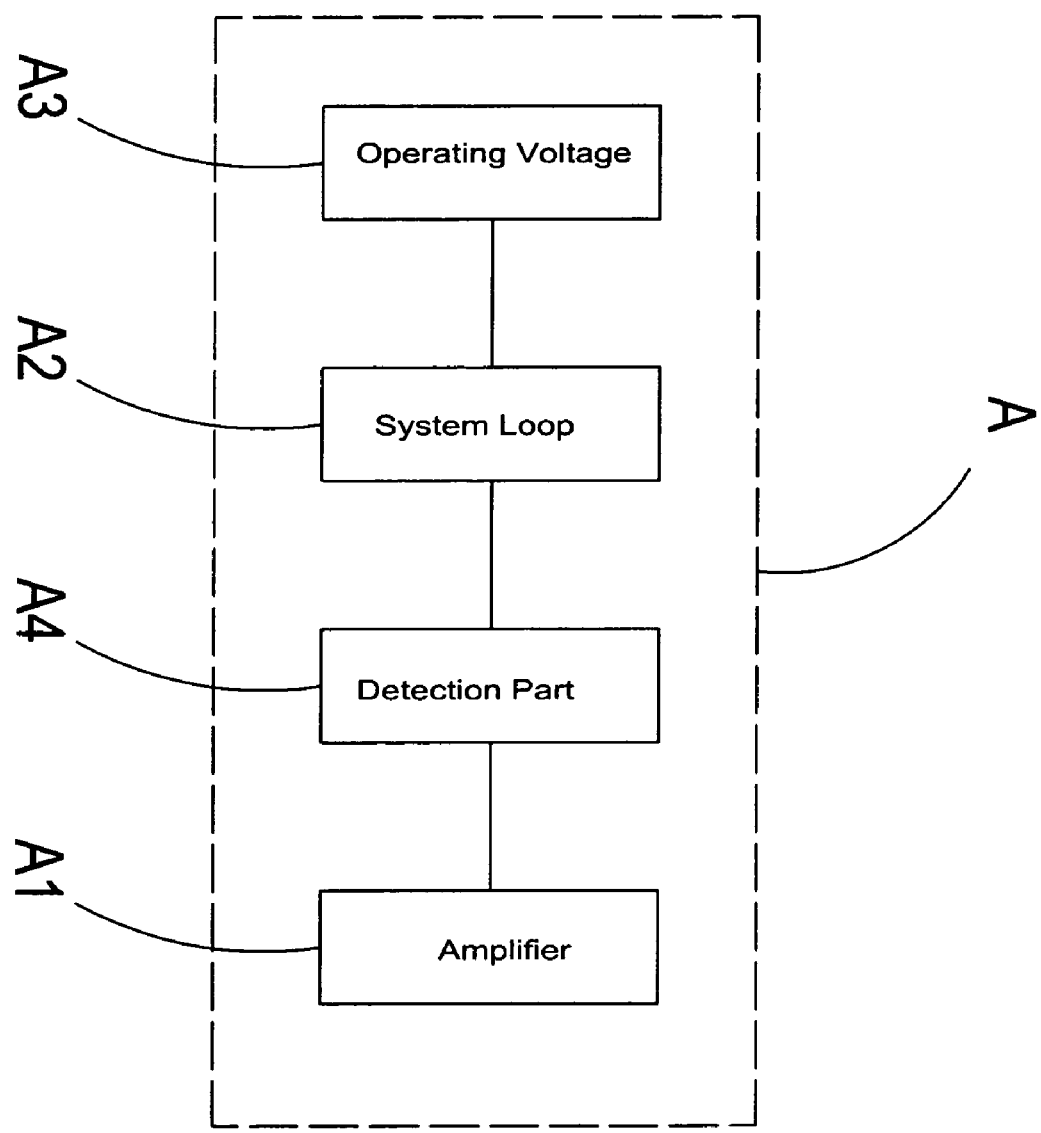
FIG. 1 shows a block diagram of a conventional application.
Figure 2:
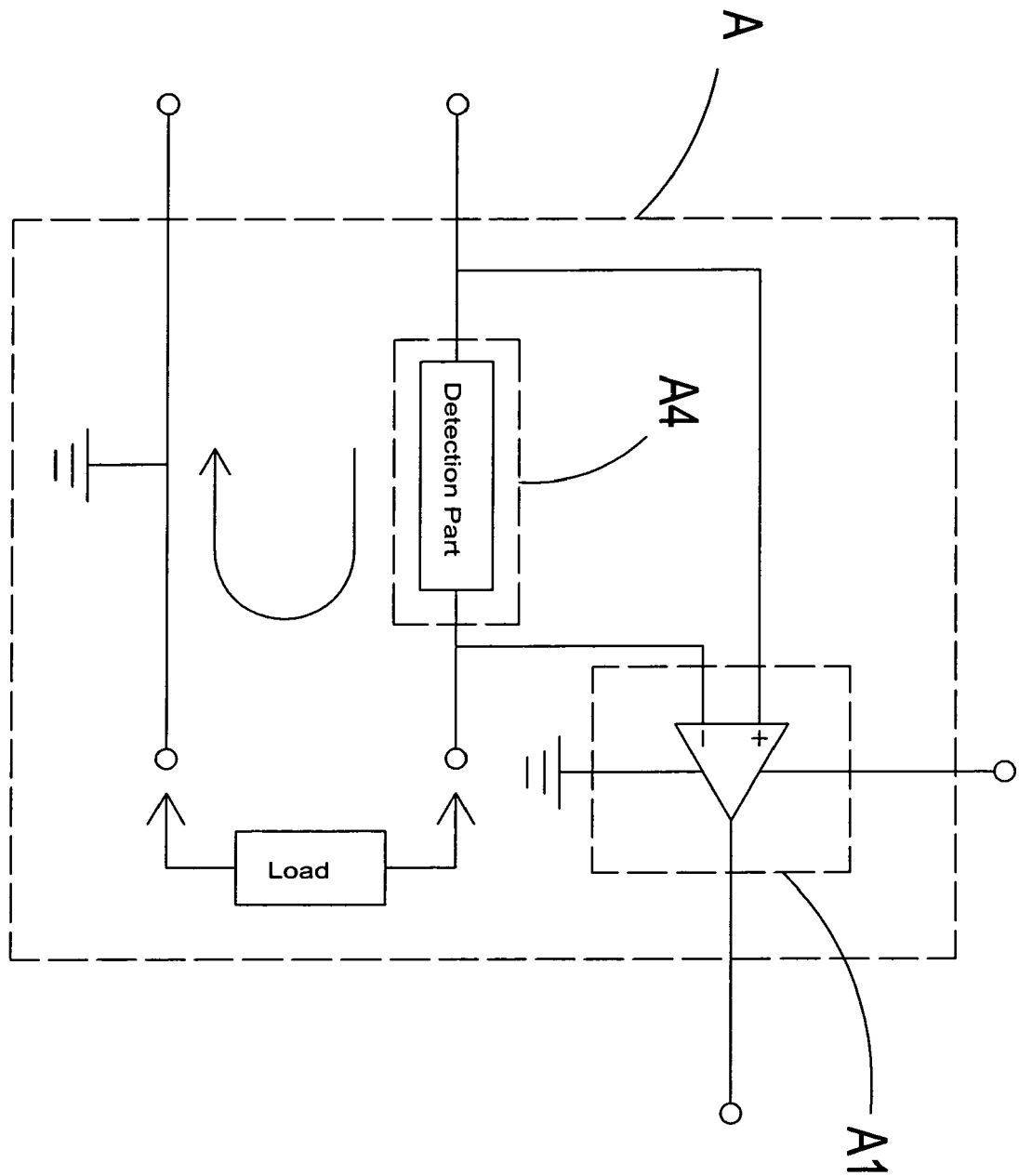
FIG. 2 shows a circuit diagram of a conventional application.
Figure 3:
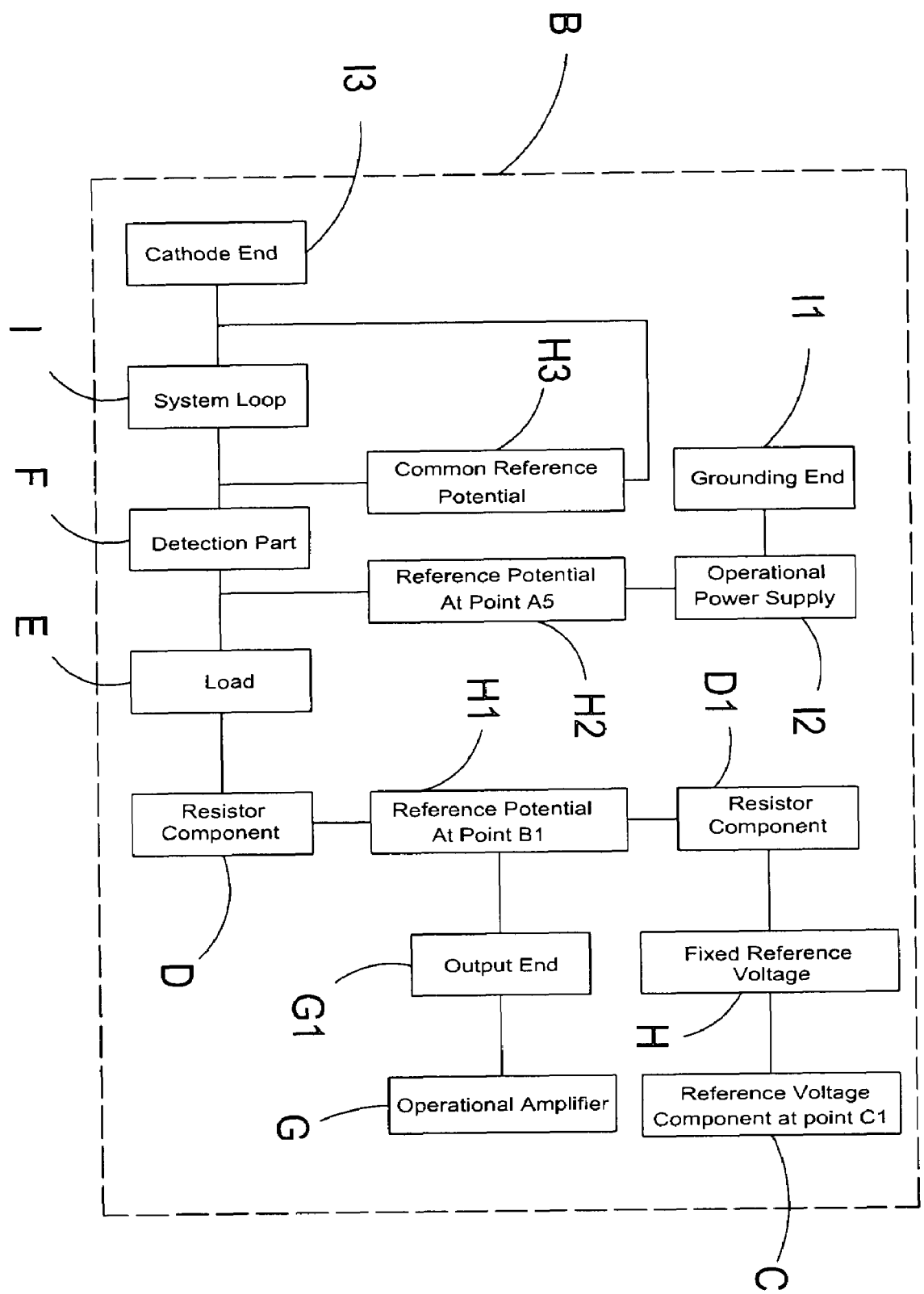
FIG. 3 shows a block diagram of the present invention.
Figure 4:
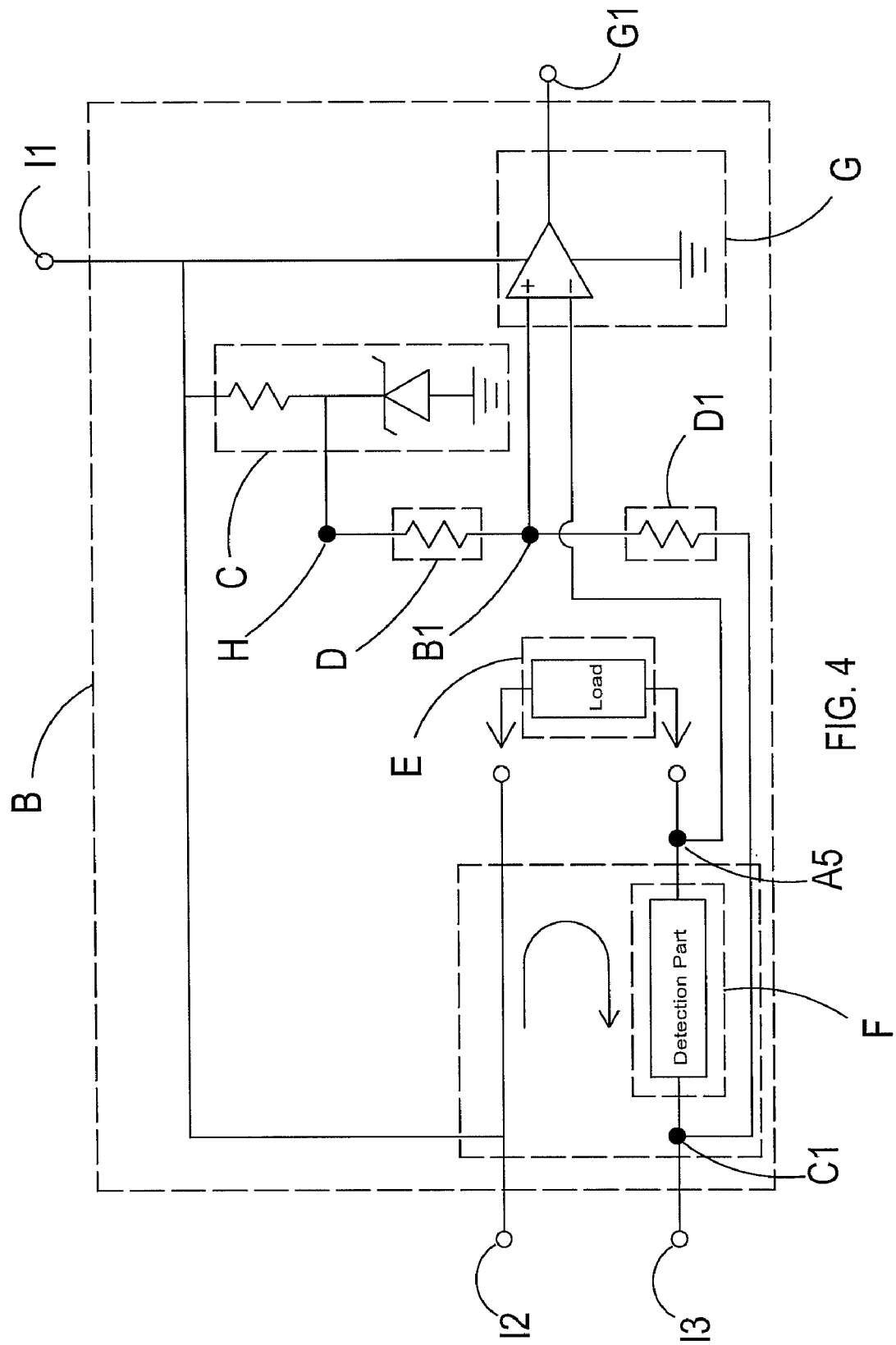
FIG. 4 shows a circuit diagram of the present invention.

The present invention is to provide an improved current-to-voltage detection circuit. Referring to FIG. 3 and FIG. 4, the present invention is composed of a detection circuit B, a reference voltage component C, a resistor component D, a load E, a detection part F, and an amplifier F, wherein the detection circuit B uses the reference voltage component C to produce a fixed reference voltage H which can be processed with a voltage dividing through the resistor component D to come up with a reference potential H1 at a point B. In addition, when the load E is turned on to form a system loop I, a current can flow through the load E and the detection part F.

An end of the detection part F is connected to a grounding end 11 of operational power supply 12, and the other end of detection part F is connected to a cathode end 13 of the system loop I. A potential level of the detection part F is connected to the grounding end 11. The grounding end 11 is proportional to a size of current flowing through the detection part F so that a reference potential H2 of tiny mV is produced at a point A. In addition, when comparing the point A with the point B, a common reference potential H3 is obtained at a point C.

When the reference potential H2 at the point A is greater than the reference potential H1 at the point B, a voltage at an output end G1 is converted from a low potential into a high potential, through the output end G1 of amplifier G. In the mean time, a circuit of related system can be controlled through a variation between the potentials. In addition, a level of reference potential H1 at the point B can be changed, after changing a resistance of the resistor component D. On the other hand, by setting the level of reference potential H1 at the point B, the voltage at the output end G1 of amplifier G can be converted from the low potential into the high potential, and the size of current of the loop can be obtained according to the potential level at output end G1. At the same time, this function can also be utilized to restrict and fix the size of current.

Figure 5:
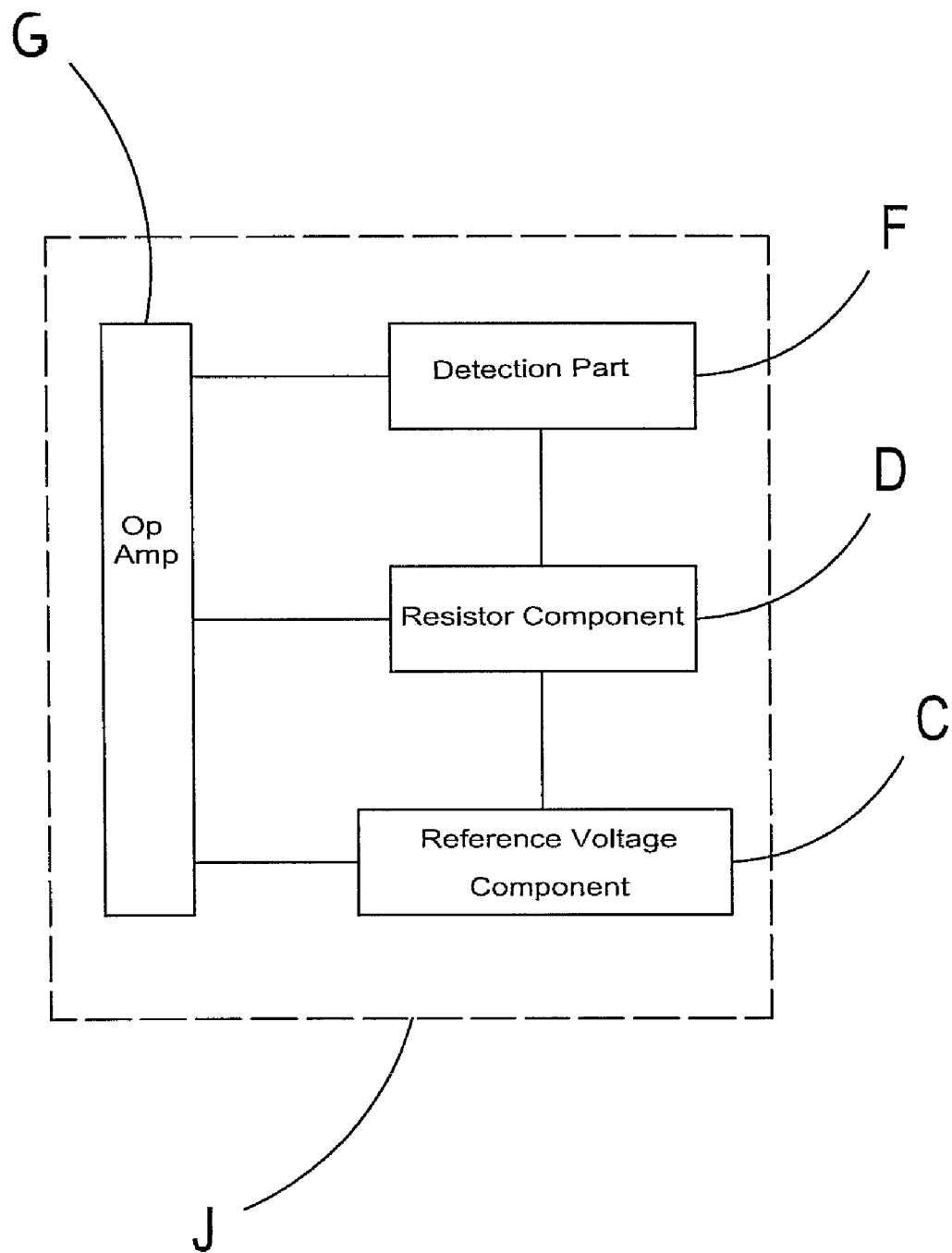
FIG. 5 shows a schematic view of a further embodiment of the present invention.

Referring to FIG. 3 and FIG. 5, the reference potential component C is used to produce the fixed reference potential H which can be processed with the voltage dividing through the resistor component D to produce the reference potential H1 at the point B. When the load E is turned on to form the system loop I, the current will flow through the load B and the detection part F. In the mean time, the grounding end I1 which is connected to one end of the detection part F can produce the reference potential H2 of a tiny mV at the point A, and the common reference potential H3 at the point C is produced upon comparing the point A with the point B. When the reference potential H2 at the point A is greater than the reference potential H1 at the point B, the voltage at output end G1 of amplifier G is converted from the low potential into the high potential. In the mean time, the related circuit can be controlled using the change between potentials.

The current which flows through the detection part F includes a fixed current, a fixed voltage, a restricted current, and a restricted voltage. In the mean time, the voltage at output end G1 of the amplifier G can be converted from the low potential into the high potential to restrict and control the size of current, by changing the level of reference potential at the point B. Furthermore, the detection part F can be a Mn—Zn—Cu wire, an Oxygen-Free-Copper wire, a resistor component, and any metallic wire which is provided with an extremely small resistance and a good conductivity. In addition, a range of detecting the current size can be expanded by increasing an amount of wires of power supply.

The amplifier G which is connected to the detection circuit B can be further a semiconductor component and a related electronic component for connecting to the system loop, which are provided with an amplification function. When the reference potential H2 at the point A is greater than the reference potential H1 at the point B, the voltage at output end G1 of amplifier G is converted from the low potential into the high potential. In the mean time, the circuit of related system can be controlled through the change between potentials. In addition, the level of reference potential H1 at the point B can be changed after changing the resistance of resistor component D, and the voltage at output end G1 of amplifier G can be converted from the low potential into the high potential by setting the level of reference potential H1 at the point B. On the other hand, the size of current of the loop can be obtained according to the potential level at the output end G1, and the detection circuit B can further integrate the reference potential component C, the resistor component D, the detection part F, and the amplifier G into a detection module F, to effectively improve a connection and an application of related system circuit, thereby increasing a sensitivity and saving a cost.

To further manifest the advancement and practicability of the present invention, the present invention is compared with a conventional application as below:

Shortcomings of a Conventional Application

1. The potential difference between the positive end and the cathode end of amplifier should be greater than 40 mV.
2. It is easy to be affected by the interference of noise of ambient environment, thereby producing a wrong action.
3. It is easy to be affected by the interference of noise of system loop, thereby producing a wrong action.
4. When the potential difference between two ends of the detection part is too small, it is easy to prohibit the amplifier to operate.
5. The voltage detected at the output end of amplifier should be smaller than the operational voltage itself.
6. Two sets of operational power supplies should be used to allow the amplifier to operate normally.

Advantages of the Present Invention

1. By connecting one end of the detection part to the grounding end of operational power supply, and connecting the other end of detection part to the cathode end of system loop, the interference of noise of ambient environment can be effectively removed.
2. By changing the resistance of resistor component and then setting the level of reference potential at the point B, the voltage at the output end of amplifier can be used to detect the size of current.
3. By converting the voltage at the output end of amplifier from the low potential into the high potential, and using the setting of reference potential at the point B, the function of detecting and controlling the size of current can be achieved.
4. The detection part has the extremely small resistance; therefore it is not easy to be affected by the interference of noise of ambient environment.
5. The detection part has the extremely small resistance; therefore the range of detecting the size of current can be effectively increased.
6. The detection part is connected to the grounding end; therefore it can be operating normally with only one set of operational power supply.
7. It is provided with the advancement and practicability.
8. It is provided with an industrial competitiveness.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A current-to-voltage detection circuit comprising:
    a detection part (F) is connected to a cathode end (I3) of a system loop (I), and the other end of the detection part is connected to a grounding end (I1) of an operational power supply (I2), wherein the detection part produce a reference potential (H2) of a tiny mV at a point A and effectively remove interference of noise of ambient environment;
    a reference voltage component (C) are used to produce a fixed reference voltage (H), the fixed reference voltage is compared to the voltage produced by the detection part, the fixed reference voltage is processed with a voltage dividing to come up with a reference potential (H1) at a point B and a relative voltage of resistor with respect to a ground is used to serve as the reference potential (H2) at the point A;
    a current being able to flow through a load (E) and the detection part when the load is turned on to form the system loop;
    a common reference potential to the point A and point B being produced by the fixed reference voltage;
    a variable resistor component (D) for setting the level of the reference potential H1 at the point B to detect the size of the current; and
    an amplifier (G) for converting the voltage at its output end G1 from low potential into high potential to detect and control the size of current of the loop when the reference potential at the point A is greater than the reference potential at the point B.

2. The current-to-voltage detection circuit according to claim 1, wherein the detection circuit further integrates the reference voltage component, the resistor component, the detection part, and the amplifier into an integrated circuit (IC), to effectively improve a connection and an application of related circuit.

3. The current-to-voltage detection circuit according to claim 1, wherein the current of detection part includes further a fixed current, a fixed voltage, a restricted current, and a restricted voltage, and the voltage at the output end of amplifier can be converted from the low potential into the high potential to restrict and control the size of current, by changing the level of reference potential at the point B.

4. The current-to-voltage detection circuit according to claim 1, wherein the detection part can be further a Mn—Zn—Cu wire, an Oxygen-Free-Copper wire, a resistor component, or metallic wire which is provided with an extremely small resistance and a good conductivity, and a range of detecting the size of current can be expanded by adding an amount of wires of power supply.

* * * * *